United States Patent [19]
Kishimoto et al.

[11] Patent Number: 5,506,177
[45] Date of Patent: Apr. 9, 1996

[54] FABRICATION PROCESS FOR MULTILEVEL INTERCONNECTIONS IN A SEMICONDUCTOR DEVICE

[75] Inventors: Koji Kishimoto; Tetsuya Homma, both of Tokyo, Japan

[73] Assignee: NEC Corporation, Tokyo, Japan

[21] Appl. No.: 394,943

[22] Filed: Feb. 24, 1995

[30] Foreign Application Priority Data

Feb. 28, 1994 [JP] Japan ........................... 6-030667

[51] Int. Cl.⁶ .................................................. H01L 21/44
[52] U.S. Cl. ......................... 437/195; 437/231; 437/228; 437/982
[58] Field of Search ........................ 437/195, 231, 437/982, 228 G; 148/DIG. 133

[56] References Cited

U.S. PATENT DOCUMENTS 5,145,723  9/1992  Ballance et al. .................. 427/397.7

FOREIGN PATENT DOCUMENTS 2237030  9/1990  Japan ................................... 437/231
3116733  5/1991  Japan ................................... 437/231

OTHER PUBLICATIONS

Ballance, David S., et al., "Low Temperature Reflow Planarization Using a Novel Spin–On Interlevel Dielectric", Jun. 9–10, 1992 VMIC Conference, 1992 ISMIC–101/92/0180, pp. 180–188.

Primary Examiner—George Fourson
Assistant Examiner—C. Everhart
Attorney, Agent, or Firm—Young & Thompson

[57] ABSTRACT

After forming lower level wiring and plasma oxide layer, SOG film is applied by applying a solution containing hydrogen silsesquioxane as primary component under rotation. Pre-baking of the SOG film is performed by a first heat treatment and causes reflow thereof by a second heat treatment at a temperature higher than the first heat treatment. Subsequently, another plasma oxide layer is formed. By this, in an interlayer insulation layer including SOG film, occurrence of crack and so forth can be prevented and water resistance can be improved.

10 Claims, 7 Drawing Sheets

FABRICATION PROCESS FOR MULTILEVEL INTERCONNECTIONS IN A SEMICONDUCTOR DEVICE

BACKGROUND OF THE INVENTION

1. Field of the Invention

The present invention relates generally to a fabrication process for a semiconductor device. More specifically, the invention relates to a method for forming an interlayer insulation layer in a semiconductor device having multilevel interconnection, 2. Description of the Related Art Associated with increasing of package density in a semiconductor device, it becomes essential to employ multilevel interconnection in the fabrication of the semiconductor device. As interlayer insulation layer of the multilevel interconnection in the semiconductor devices, silicon oxide type insulation layer has been primarily employed for the purpose reduction of parasitic capacitance between wirings, such as between an upper level wiring and a lower level wiring and so forth. Due to increasing package density, the gap between the wirings in the lower level wiring is reduced to provide higher aspect ratio (film thickness of the lower level wiring (=height of the lower level wiring/gap between wiring in the lower level wiring) between the wiring. Therefore, in past processes of formation of the interlayer insulation layer, it has been required that the surface of the interlayer insulation layer is smooth enough and the gap fill capability of the interlayer insulation layer between the wiring in the lower level wiring is higher. Furthermore, in order to reduce parasitic capacitance between the upper level wiring and the lower level wiring, it is preferable to have thicker interlayer insulation layer above the upper surface of the lower level wiring. As the conventional method for forming the interlayer insulation layer satisfying such requirement, there are two ways, i.e. a method employing an SOG layer and a method of reflow of PSG layer or BPSG layer.

The method of reflow of BPSG layer and so forth may be employed in the case where the lower level wiring is formed of polycrystalline silicon film, refractory metal film, refractory metal silicide film or refractory metal polycide film, but is not applicable in the case where the lower wiring is formed of aluminum or its alloy, copper or copper alloy or gold or gold alloy. The necessary temperature for performing reflow is approximately 800° C. at the lowest. When the primary material of the lower level wiring is aluminum type metal, the temperature to perform reflow is higher than the melting point of the aluminum type metal. On the other hand, when the primary material of the lower level wiring is copper or gold, the melting points of the copper and gold are higher than the required temperature for performing reflow. However, in these cases, the lower level wiring becomes a stacked metal film, in which barrier metal films are provided at upper and lower sides of the copper or gold film. At the required temperature, thermal diffusion of copper and gold cannot be restricted by the barrier metal films in the case of the stacked metal film.

With respect to the case where the primary material of the lower level wiring is aluminum type metal, the conventional method employing the SOG film will be discussed briefly for facilitating better understanding of the invention, which will be discussed later.

At first, necessary semiconductor elements are formed on the surface of a semiconductor substrate. Thereafter, a BPSG film, for example, is deposited over the entire surface. By reflowing the BPSG film, an undercoat insulation layer is formed. Through the undercoat insulation layer, necessary contact holes are formed. Thereafter, by sequential sputtering of a titanium film, a titanium nitride film (or tungsten nitride film), aluminum-copper-silicon alloy film and titanium nitride film (or tungsten nitride film), a stacked metal film having 800 nm of film thickness is formed. By performing patterning for the stacked metal film in a known method, a plurality of lower level wiring are formed. A minimum gap between these lower level wiring is 0.4 μm. At such portion, an aspect ratio of the gap portion between two lower level wiring becomes approximately 2. At this time, the lower level wiring and the undercoat insulation layer have tensile stress and compressive stress, respectively, relative to a silicon substrate.

Next, the surface of the undercoat insulation layer including the lower level wiring is covered with a silicon oxide layer of approximately 200 nm of layer thickness by chemical vapor deposition. It should be noted that the layer thickness becomes 200 nm at the portion directly covering the upper surface of the lower level wiring and the upper surface of the undercoat insulation layer but becomes 100 to 150 nm at the portion covering the side surface of the lower level wiring. Therefore, the aspect ratio of the above-mentioned gap covered with the silicon oxide layer becomes 4 to 8. Since the growth temperature in chemical vapor deposition is limited by the component of the lower level wiring and thus is merely 450° C. Also, as the chemical vapor deposition method, a plasma chemical vapor deposition is preferred in view of matching ability with the stress on the undercoat insulation layer and of step coverage ability for the lower level wiring. At this time, the silicon oxide layer has a compressive stress on the order of $1 \times 10^8$ Pa.

Next, a solution containing poly silicic acids $(nSiO_2 \cdot m(H_2O))$ (here, molecular weight is 1000 g/mol, n is approximately 30 to 40, m is one of the values of n−2, n−1, n and n+1) as a primary element and an organic solvent is applied onto the surface of the silicon oxide later under rotation at 5000 r.p.m. for example. Subsequently, at a temperature approximately 150° C., pre-baking is performed for about one minute to remove the solvent. By this process, the surface of the silicon oxide layer can be covered with SOG film. The film thickness of this SOG film is merely 200 nm at the position above the upper surface of the lower level wiring. At this time, the gap portion having the aspect ratio of 4 to 8 is also filled with the SOG film completely. At this step, the SOG film contains a large amount of silanol bond (Si—OH). Subsequently, heat treatment at a temperature approximately 300° C. is performed for about 30 minutes. By this heat treatment, dehydrogenation is caused in the SOG film (one molecule of $H_2O$ is separated from two silanol bond) so that most of silanol bond is converted into siloxane bond (Si—O—Si). The thermally processed (inorganic) SOG film has the tensile stress on the order to $1 \times 10^8$ Pa.

While thick organic type SOG film may be formed when an organic solvent containing polysiloxanes $((SiR_2O)_n)$ as the primary component, it is not desirable to retain such organic type SOG film since alkyl group resides in such organic type SOG film.

Subsequently, as required, the foregoing SOG film formation process is repeated on the order of one to three times. Subsequently, by performing etching of the SOG film by way of anisotropic etching to form an interlayer insulation layer of silicon oxide with substantially smooth surface with maintaining the SOG film within the gap portion. Furthermore, if required, a second silicon oxide layer is formed over the entire surface by way of chemical vapor deposition method. Then, a via hole reaching the lower level wiring is formed. Subsequently, the upper level wiring of aluminum or aluminum alloy is formed. Thus, the semiconductor device is fabricated.

However, in the case of the method for forming the interlayer insulation layer employing (inorganic type) SOG film taking poly silicic acids as starting material, heat treatment at a temperature on the order of 300° C. becomes necessary for covering silanol bond to siloxane bond. By dehydrogenation by heat treatment, shrinkage of volume is caused in the thermally processed SOG film by more than or equal to 20% in comparison with the volume of the SOG film before heat treatment. The thermally processed SOG film has a network structure by the siloxane bond. However, not all of silanol bond can be converted into siloxane bond by the heat treatment. Therefore, the network structure of the (inorganic type) SOG film has high possibility to be terminated at the silanol bond which is hydrophilic radical. Also, as set forth above, the SOG film after heat treatment has high tensile stress.

Therefore, the conventional method for forming the interlayer insulation layer employing the SOG film, as set forth above, encounters the following problems. At first, as set out above, the thermally processed SOG film causes a large amount of shrinkage in volume in comparison with the SOG film immediately after pre-baking. When the film thickness of the SOG film becomes 150 to 200 nm, cracks and voids tends to be caused to degrade smoothness of the surface of the interlayer insulation layer and gap fill at the gap portion. As a result, breakage of upper level wiring, shorting between wiring in the upper level wiring or between the upper level wiring and the lower level wiring, degradation of migration resistance of the upper level wiring and so forth can be caused. The practically useful film thickness of the SOG film formed through one process step is merely on the order of 100 nm. Therefore, in order to certainly obtain sufficient thickness of the interlayer insulation layer with the SOG film, the foregoing process has to be repeated for a plurality of times making the fabrication process long.

Next, since the thermally processed SOG film has high tensile stress and has high possibility to terminate the network structure at silanol bond as hydrophilic radical, the SOG film tends to relax the stress by absorbing water. As a result of this, humidity resistance of the upper level wiring (or lower level wiring) can be degraded.

A method for forming the interlayer insulation layer employing new SOG film for solving the problems set forth above, has been reported in Paper of VLSI Multilevel Interconnection Conference, 1992, pp 180 to 186. The reported method is as follows:

At first, the undercoat insulation layer covering the entire surface of the semiconductor substrate is formed. Then, after forming lower level wiring with aluminum film, a solution containing hydrogen silsesquioxane $((HSiO_{3/2})_n)$ as the primary component is applied over the entire surface. After pre-baking at 150° C., heat treatment is performed at 200° C. for 60 seconds, at 300° C. for 60 seconds and 450° C. for 15 minutes to form a new SOG film.

The characteristics of this new SOG is as follows. The molecular weight of the starting material of this SOG is sufficiently larger than the molecular weight of the poly silicic acids as the starting material of the conventional inorganic SOG film. Therefore, it becomes possible to make the film thickness thicker in comparison with the conventional inorganic type SOG film. This SOG film has a property to cause glass transition at a temperature approximately 200° C. This SOG film has siloxane network terminating at Si—H bond, which is a hydrophobic radical. Therefore, it has superior water-proofing characteristics over the conventional SOG film.

The inventors have performed supplementary experiments of formation of the interlayer insulation layer with the new SOG film according to the report. After final heat treatment, the volume shrinkage ratio of this SOG film was approximately 4%. The SOG had tensile stress comparable ($1 \times 10^8$ Pa) with the conventional inorganic type SOG film formed from poly silicic acids as the starting material.

Through the supplementary experiments, it has become clear that while the film thickness of the SOG film can be made thicker than the inorganic SOG film made of poly silicic acid as the starting material, occurrence of cracks becomes substantial when the film thickness reaches about 500 nm. Occurrence of such cracks and so forth is caused by relaxation of stress similarly to the conventional inorganic type SOG film. However, different from the conventional inorganic SOG film, it does not accompany substantial water absorption characteristics.

SUMMARY OF THE INVENTION

It is therefore an object of the present invention to provide a method for forming an interlayer insulation layer including the above-mentioned SOG film made of hydrogen silsesquioxane.

Another object of the present invention is to provide a method for forming an interlayer insulation layer eliminating occurrence of cracks, voids and so forth to provide sufficient film thickness.

A further object of the present invention is to provide a method for forming an insulation layer having sufficiently high humidity proofing characteristics.

In a fabrication process for a semiconductor device according to the present invention, a stacked insulation layer between lower level wiring and upper level wiring is formed through the following steps. At first, after forming a plurality of lower level wiring with arranging insulation layer therebetween, on the surface of a silicon substrate, a first silicon oxide layer covering the surfaces of said lower level wiring and the surface of said insulation layer is formed by a first plasma chemical vapor deposition method. Then, a SOG film covering said first silicon oxide layer is formed by applying a solution containing hydrogen silsesquioxane $((HSiO_{3/2})_n)$ as a primary component and pre-baking by a first heat treatment, and performing reflow of said SOG film by a second heat treatment at a temperature higher than that of said first heat treatment. Thereafter, a second silicon oxide layer covering the surface of the reflown SOG film is formed by a second plasma chemical vapor deposition.

As a result, an interlayer insulation layer formed by the process according to the present invention can satisfy in gap fill for the gap portion between the lower level wiring and has a sufficiently smooth surface to facilitate relaxation of stress and provide superior water resistance and moisture resistance. Therefore, formation of cracks, voids and so forth in the interlayer insulation layer can be restricted. Also, moisture resistance of the upper level wiring and the lower level wiring can be improved, and workability is also improved to successfully avoid breakage of the upper level wiring, degradation of migration resistance, occurrence of shorting between upper level wiring, between upper and lower level wiring and so forth. Furthermore, according to the present invention, sufficient thickness of interlayer insulation layer can be easily formed without extending the fabrication process.

BRIEF DESCRIPTION OF THE DRAWINGS

The present invention will be understood more fully from the detailed description given herebelow and from the accompanying drawings of the preferred embodiment of the invention, which, however, should not be taken to be limiting the present invention, but are for explanation and understanding only.

In the drawings.

DESCRIPTION OF THE PREFERRED EMBODIMENT

The preferred embodiments of the present invention will be discussed hereinafter with reference to the accompanying drawings. In the following description, numerous specific details are set forth in order to provide a thorough understanding of the present invention. It will be obvious, however, to those skilled in the art that the present invention may be practiced without these specific details. In certain instances, well-known structures are not shown in detail in order to avoid unnecessarily obscuring the present invention.

Figure 2:
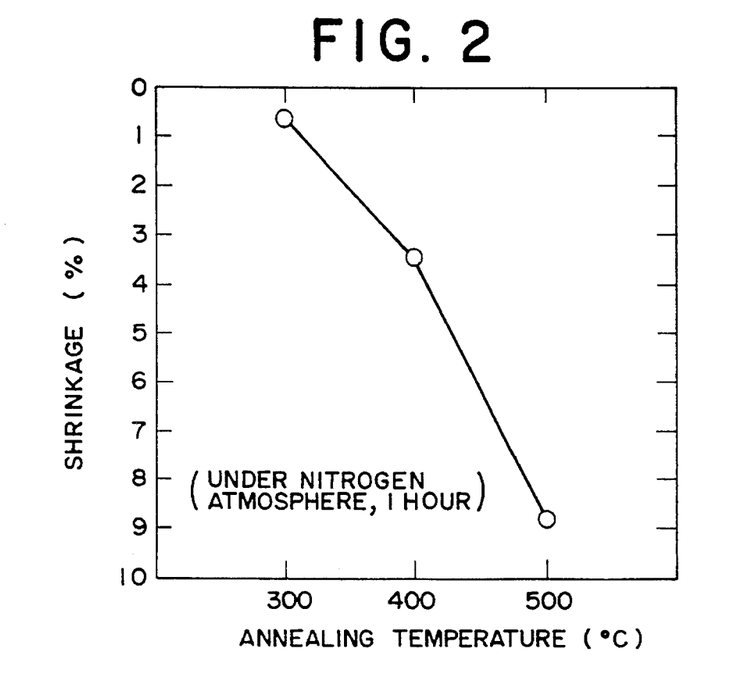
FIG. 2 is a graph for demonstrating the characteristics of SOG film in the first embodiment, in which is shown a dependency of shrinkage ratio of the SOG film upon a temperature in a heat treatment.
Figure 3:
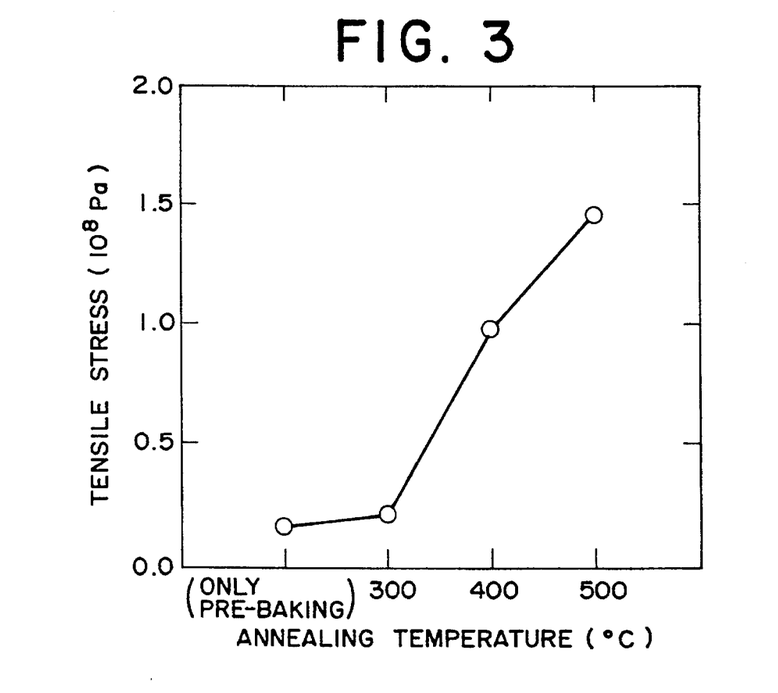
FIG. 3 is a graph for demonstrating the characteristics of SOG film in the first embodiment, in which is shown a dependency of stress of the SOG film upon a temperature in a heat treatment.

FIGS. 1A to 1G are diagrammatic sections showing a sequence of processes in fabrication of the semiconductor device according to the first embodiment. FIGS. 2 and 3 are graphs showing dependencies of shrinkage ratio and tensile stress upon a heat treatment temperature of a SOG film formed of hydrogen silsesquioxane $((HSiO_{3/2})_n)$ of molecular weight: approximately 10000 g/mol; n is approximately 181 to approximately 195) as the starting material. With reference to FIGS. 1A to FIG. 3, the first embodiment of the present invention will be discussed. The shown embodiment is directed to a fabrication process of the semiconductor device, in which a lower level wiring is formed of a material containing aluminum type metal as the primary component, and the above-mentioned SOG film is included.

Figure 1A:
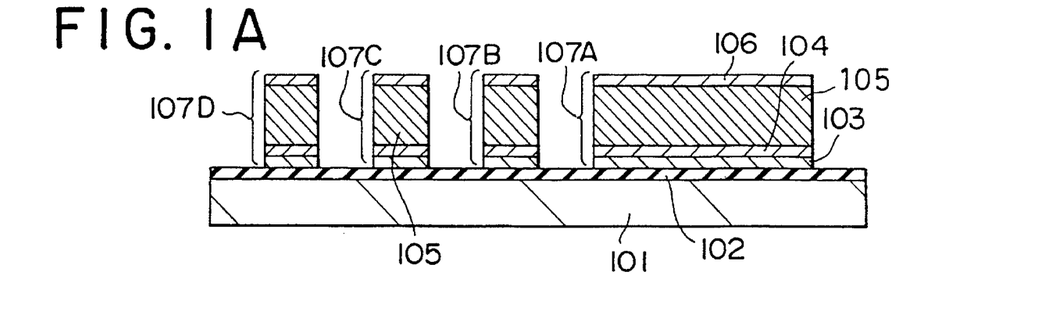
FIGS. 1A to 1G are diagrammatic sectional views showing fabrication process of the first embodiment of the present invention.

At first, as shown FIG. 1A, necessary semiconductor elements (not shown) are formed on the surface of a silicon substrate 101. Then, an undercoat insulation layer, such as a BPSG film and so forth, is deposited over the entire surface. By performing reflow of the deposited layer, a BPSG film 102 is formed. Subsequently, contact holes (not shown) are formed through the BPSG film 102. It should be noted that while the upper surface of the BPSG film 102 is smooth, it is not essential to be smooth.

Then, on the BPSG film 102, a titanium film in a film 103 thickness of about 100 nm, a titanium nitride film 104 (can be tungsten nitride film) in a film thickness of about 100 nm, a aluminum-copper-silicon alloy film 105 in a thickness of about 550 nm and a titanium nitride film 106 (can be tungsten nitride film) are sequentially deposited by way of sputtering to form a stacked metal film in a thickness about 800 nm. Subsequently, by performing patterning in per se known manner, lower level wiring 107A, 107B, 107C and 107D are formed. The minimum gap between these lower level wiring 107A, 107B, 107C and 107D is 0.4 µm. In such portion where the gap becomes minimum, an aspect ratio at the gap portion disposed between two lower level wiring becomes approximately 2. At this time, the BPSG film 102 and the lower level wiring 107A, 107B, 107C and 107D and so forth respective have compression stress and tensile stress with respect to the silicon substrate 101.

Figure 1B:
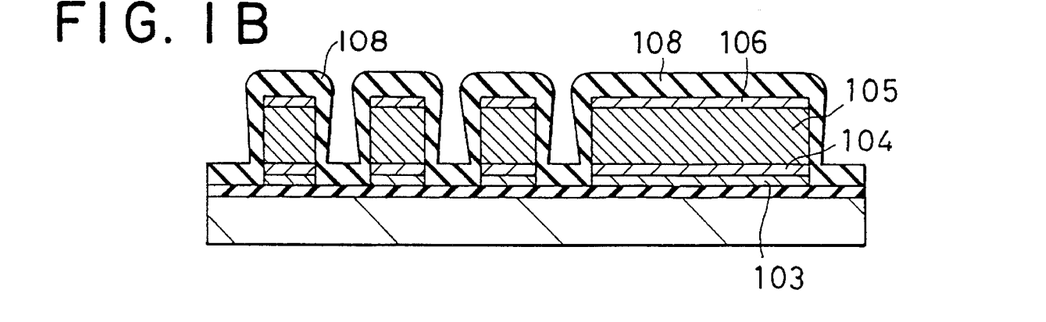

Next, as shown in FIG. 1B, a first silicon oxide layer (hereinafter referred to as "plasma oxide layer") 108 covering the exposed surface of the lower level wiring 107A, 107B, 107C and 107D and so forth and the exposed surface of the BPSG film 102 by plasma chemical vapor deposition with gas generated by bubbling of tetraethylorthosilicate $(Si(OC_2H_5)_4;$ TEOS) with nitrogen, argon or helium, and oxygen, as material. The plasma oxide layer 108 has a compressive stress about $1 \times 10^8$ Pa with respect to the silicon substrate 101. Growth temperature of the plasma oxide layer 108 (heating temperature for the back side surface of the silicon substrate 101) is 400° C., for example. The growth period is 2 to 3 minutes. The plasma oxide layer 108 has superior step coverage ability. The layer thickness of the plasma oxide layer 108 is 200 nm at the portions directly covering the upper surface of the lower level wiring 107A and so forth and the upper surface of the BPSG film 102, and 100 to 150 nm at the portions directly covering the side surface of the lower level wiring 107A and so forth. Therefore, the aspect ratio of the gap portion covered by the plasma oxide layer 108 becomes 4 to 8.

It should be noted the growth temperature of the plasma oxide layer 108 is selected for shortening the growth period. Even when the growth temperature is set at 400° C. at this stage, since thin alumina layer is formed on the side surface of the aluminum-copper-silicon alloy film 105, reflow may not be caused in the aluminum-copper-silicon alloy film 105. The growth temperature may be lowered to be 300° C., if necessary. On the other hand, in place of plasma chemical vapor deposition with TEOS and oxygen, plasma chemical vapor deposition employing silane $(SiH_4)$ and nitrogen monoxide $(N_2O)$ as material. The growth temperature in this plasma chemical vapor deposition method is approximately in a range of 270° to 300° C. It should be noted that, in this case, the step coverage for the lower level wiring 107A and so forth becomes slightly worse than the plasma oxide layer 108 formed by plasma chemical vapor deposition with TEOS and oxygen.

Figure 1C:
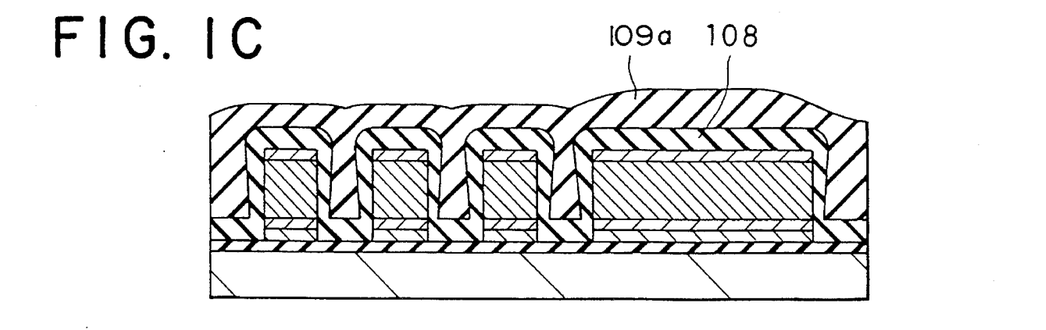

Thereafter, as shown in FIG. 1C, a solution containing hydrogen silsesquioxane $((HSiO_{3/2})_n)$ (molecular weight: approximately 10000 g/mol; n is about 180 to 195) as primary material (approximately 20 Wt % is contained) and methyl isobutyl ketone $(CH_3COC_2H_3(CH_3)_2;$ MIBK) as solvent, is applied over the entire surface under rotation at approximately 1000 r.p.m. Then, pre-baking as the first heat treatment for heating at 200° C. for 2 minutes is performed on a hot plate to completely evaporate the solvent and thus to form SOG film (not shown) covering the surface of the plasma oxide layer 108. Dehydrogenation and reflow of the SOG film after pre-baking is performed by the second heat treatment, in which heating is performed at 300° C. for approximately 1 hour to form a SOG film 109a. The SOG film 109a has smooth upper surface. The film thickness of the SOG film 109a is 200 to 300 nm at the portion about the upper surface of the lower level wiring 107A, 107B, 107C and 107D and 700 nm at the portion above the BPSG film 102 where the gap of the lower level wiring is wide. Also, the gap portion of the lower level wiring where the aspect ratio becomes 4 to 8 is completely filled with the SOG film 109a.

FIG. 2 shows a relationship between shrinkage ratio and a temperature of the heat treatment, in which the horizontal axis represents the heat treatment temperature and the vertical axis represents shrinkage ratio. The SOG film taking hydrogen silsesquioxane as a starting material causes glass transition at approximately 200° C. Setting of the temperature of the pre-baking as the first heat treatment is caused simultaneously with removal of the solvent and glass transition. By dehydrogenation, shrinkage is caused. The shrinkage ratio of the SOG film 109a versus the SOG film at the step of pre-baking is less than 1%. When heat treatment under a nitrogen atmosphere is performed at 400° C. for 1 hour and T 500° C. for 1 hour in place of heat treatment at 300° C. for 1 hour, the shrinkage ratio is increased to be approximately 3% and approximately 9% respectively.

Comparing refractive index, the SOG film immediately after pre-baking has refractive index of 1.41, the SOG film 109a subject to heat treatment at 300° C. has refractive index of 1.39, and the SOG films subject to heat treatments at 400° C. and 500° C. have refractive indexes of 1.41 and 1.43, respectively. Namely, the refractive index of the SOG film 109a thermally processed at 300° C. have becomes minimum. Dielectric constant of the SOG film 109a at 1 MHz becomes approximately 3.0 and becomes smaller value than the normal silicon dioxide (by chemical vapor deposition method or thermal oxidation method). By is because the SOG film 109a has quite small water content, and have smaller film density than the normal silicon dioxide.

On the other hand, FIG. 3 is a gram showing a relationship between heat treatment temperature and tensile stress, in which the horizontal axis represents the heat treatment temperature and the vertical axis represents the tensile stress. Measuring variation of stress versus heat treatment temperature, the results becomes as follows. With respect to silicon substrate 101, the SOG film 109a, the SOG films thermally processed at 300° C., 400° C. and 500° C. have about $0.2 \times 10^8$ Pa, about $1 \times 10^8$ Pa, about $1.5 \times 10^8$ Pa of tensile stresses, respectively. In the measurement by way of Fourier transform infrared (FTIR) spectrum, the SOG film 109a and the SOG films thermally processed at 400° and 500° C. has no silanol radical immediately after heat treatment. Silanol radical and water content is detected in the SOG film thermally processed at 500° C. Despite of the fact that large stress is applied, the SOG film thermally processed at 400° C. does not contain water. From this, it becomes clear that in case of the SOG thermally processed, relaxation of stress is not associated with absorption of water. Ignoring occurrence of cracks and voids, (study for this will be done later), 300° C. to 400° C. is preferred as a temperature suitable in view of reflow ability and water-proofing ability (moisture resistance).

Figure 1D:
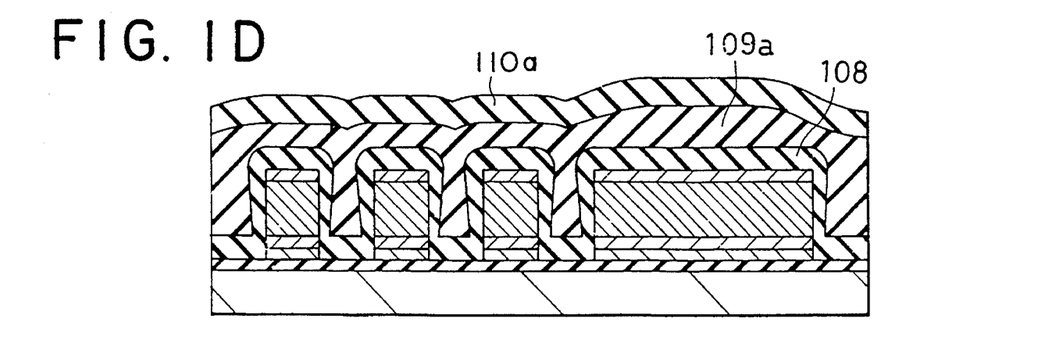

Next, as shown in FIG. 1D, by a similar method for the plasma oxide layer 108, a plasma oxide layer 110a of 300 nm of layer thickness is formed as the second silicon oxide layer. Then, formation of the interlayer insulation layer in the shown embodiment is completed. Upon formation of the plasma oxide layer 110a, the SOG film 109a is also subject to heat treatment temperature of 400° C. However, because the period is quite short, variation of the film property of the SOG film 109a can be ignored. It should be noted that the plasma oxide layer 110a may also be formed by plasma chemical vapor deposition with taking silane and nitrogen monoxide as material.

Figure 1E:
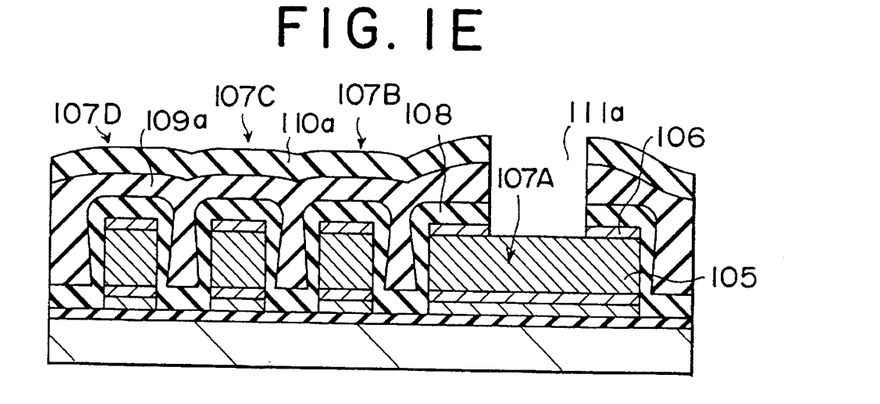

Subsequently, as shown in FIG. 1E, with taking a photoresist as a mask, the plasma oxide layer 110a, the SOG film 109a and the plasma oxide layer 108 are subject to etching sequentially to form via holes 111a reaching the lower level wiring. Etching is anisotropic etching at a power of 1200 W under 10 Pa of pressure with taking trifluoromethane ($CHF_3$) and oxygen as etching gas. In this etching, since etching rate of the titanium nitride film 106 is high, the aluminum-copper-silicon alloy film 105 is exposed at the bottom of the via hole 111a.

Figure 1F:
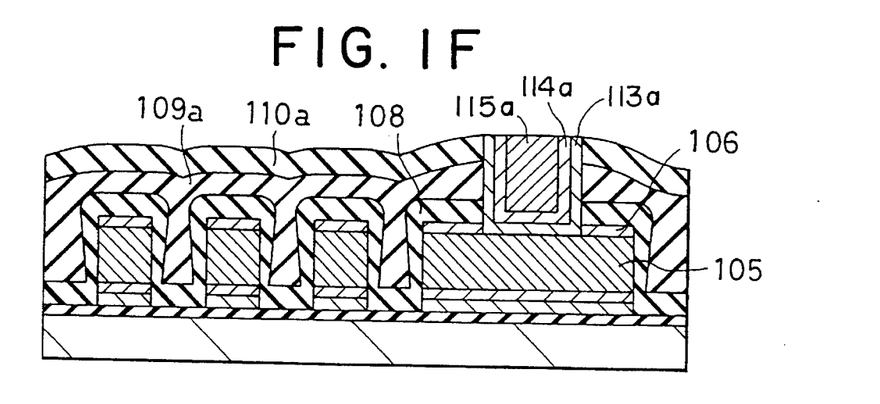

Subsequently, as shown in FIG. 1F, a titanium film 113a and titanium nitride film 114a are formed over the entire surface by sequential sputtering and a tungsten layer 115a covering the plasma oxide layer 110a is formed by chemical vapor deposition method. Subsequently, etching back is performed by plasma etching for the tungsten layer 115a until the tungsten layer 115a covering the plasma oxide layer 110a is removed. This plasma etching is performed under the following condition, for example.

As an etching gas, sulfur hexafluoride ($SF_6$) is employed and as a carrier gas, argon (Ar) gas is employed. The etching is performed at a power of 400 W under 30 Pa of pressure. By etching back under the condition set forth above, the titanium nitride film 114a and the titanium film 113a covering the upper surface of the plasma oxide layer 110a is removed. Thus, the titanium film 113a, titanium nitride film 114a and the tungsten layer 115a filling the via hole 111a are maintained.

Figure 1G:
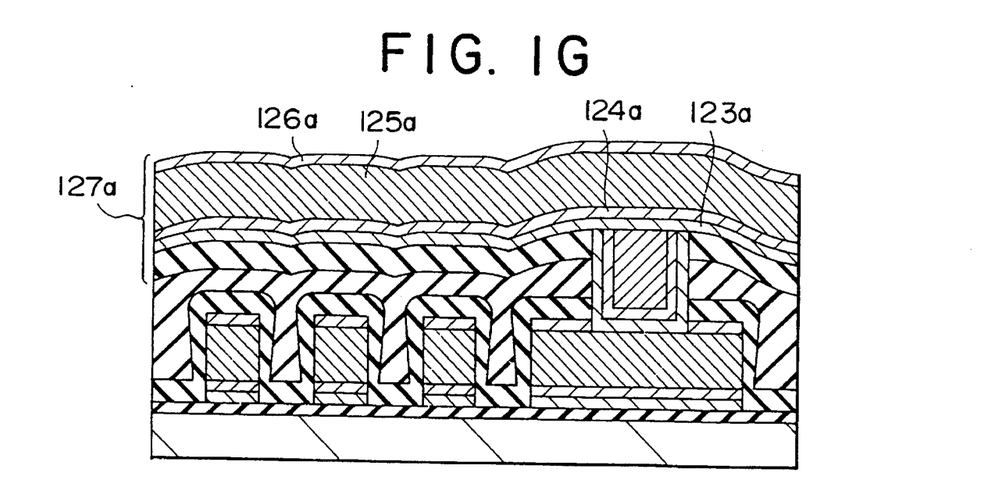

Furthermore, as shown in FIG. 1G, a titanium film 123a, a titanium nitride film 124a (can be tungsten nitride film), an aluminum-copper-silicon alloy film 125a and a titanium nitride film 126a are deposited sequentially by way of sputtering to form a stacked metal film. By performing patterning in per se known manner, an upper level wiring 127a is formed.

The SOG film 109a in the foregoing first embodiment has siloxane network terminating at hydrophobic Si—H bond, similar to the SOG film in the Paper of VLSI Multilevel Interconnection Conference, 1992, pp 180 to 186. Therefore, similar to the SOG film reported in the above-identified paper, the SOG film 109a in the shown embodiment has superior water-proofing characteristics (moisture resistance) in comparison with the conventional inorganic SOG film employing polysiloxanes (($SiR_3)O)_n$) as starting material, and prevention of degradation of the moisture resistance of the upper level wiring 127a and the lower level wiring 107A (including the portion filled in the via hole 111a) can be done easily.

On the other hand, the shrinkage ratio against the pre-baked SOG film is smaller in the SOG film 109a than the SOG film reported in the above-identified paper. Also, the SOG film 109a has lower tensile stress with respect to the silicon substrate than that of the SOG film reported in the above-identified paper. In the reported method, the tensile stress of the SOG film per se is large and the undercoat of the reported SOG film is composed of the undercoat insulation layer having compression stress and the lower level wiring having tensile stress, discontinuous is caused in the stress distribution. Therefore, it is considered that the reported SOG film easily causes cracks, voids and so forth. As a result, the film thickness of the reported SOG film cannot be greater than 500 nm.

In contrast to this, in the shown embodiment, since the tensile stress of the SOG film 109a per se is small and the undercoat for the SOG film 109a is composed of only the plasma oxide layer 108 having compression stress, there is no discontinuity in the stress distribution in the undercoat. Therefore, the SOG film 109a hardly causes cracks, voids and so forth. Furthermore, in the shown embodiment, since it has superior gap fill between the lower level wiring (for example, between the lower level wiring 107A and the lower level wiring 107B), it permits practical application even at the film thickness of 1 μm.

Also, by providing the plasma oxide layer 108, only a few cracks, voids and so forth even at the temperature of second heat treatment are formed in the SOG film 109a and, the film thickness can be reduced to be in the order of 1 μm. Even from this fact, it should become clear that the SOG film 109a may not be significantly affected by the growth temperature of the plasma oxide layer 110a covering the SOG film 109a even at 400° C.

Furthermore, in the shown embodiment, the surface of the SOG film 109a is covered with the plasma oxide layer 110a, which has compressive stress with respect to the silicon substrate. Namely, the SOG film 109a having the tensile stress is sandwiched by the plasma oxide layer 110a and the plasma oxide layer 108. Since the interlayer insulation layer in the shown embodiment is composed of the plasma oxide layer 110a, the SOG film 109a and the plasma oxide layer 108, it becomes easy to relax the stress of the interlayer insulation layer per se, the stress between the interlayer insulation layer and the lower level wiring 107A and so forth, and stress between the interlayer insulation layer and the upper level wiring 127a.

If the plasma oxide layer 110a is not provided, the upper level wiring 127a having the tensile stress is directly formed on the SOG film 109a having the tensile stress so that breakages of the upper level wiring 127a and cracks and so forth of the SOG film 109a can be frequently caused.

As set forth above, the shown embodiment facilitates formation of the SOG film having thick film thickness without causing prolongation of the fabrication process. Furthermore, since reflow process is included in formation of the SOG film 109a, the upper surface of the SOG film 109a becomes sufficiently smooth to provide good workability in formation of the upper level wiring. Thus, breakage of the upper level wiring and degradation of migration resistance can be successfully avoided. In addition, occurrence of shorting between the upper level wiring and between the upper level wiring and the lower level wiring can be significantly reduced.

It should be noted that while the foregoing first embodiment employs the aluminum based metal film for forming the lower level wiring, it is possible to employ a copper film formed by sputtering or a gold film formed by plating in place of the aluminum-copper-silicon alloy stacked film, in the first embodiment. Also, the shown embodiment is applicable in the case where the lower level wiring is formed with a polycrystalline silicon film, a refractory metal film, a refractory metal silicide film or a refractory metal polycide film.

Figure 4A:
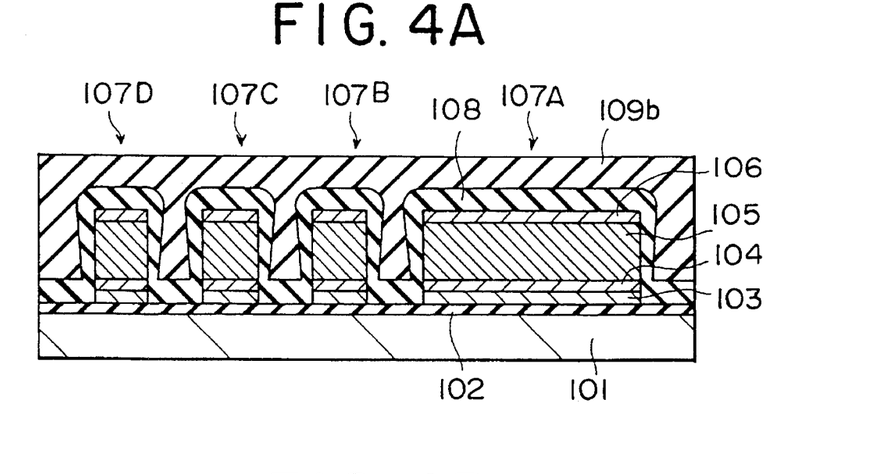
FIGS. 4A to 4C are diagrammatic sectional views showing fabrication process of the second embodiment of the present invention.

Next, the second embodiment of the present invention will be discussed with reference to FIGS. 4A to 4C. The second embodiment is differentiated from the foregoing first embodiment in the presence of a flattening process of the SOG film. Namely, the processes up to formation of the plasma oxide layer 108 (with the same thickness to the foregoing first embodiment) are the identical to those in the first embodiment set forth above.

After formation of the plasma oxide layer 108, a solution containing hydrogen silsesquioxane as primary material and methyl isobutyl ketone as solvent, is applied over the entire surface under rotation at approximately 1000 r.p.m. Then, pre-baking as the first heat treatment for heating at 200° C. for 2 minutes and a second heat treatment is performed in an oven of nitrogen atmosphere at a temperature of 300° C. for about 1 hour to form SOG film (not shown) covering the surface of the plasma oxide layer 108. The film thickness of the SOG film is on the order of 200 to 300 nm above the lower level wiring 107A, 107B, 107C and 107D and in the order of 700 nm above the surface of the BPSG film 102, where the gap between the lower level wiring is wide. Furthermore, the foregoing processes are performed repeatedly. The film thickness of the SOG film thus formed is about 600 to 700 nm above the lower level wiring 107A, 107B, 107C and 107D and about 1400 nm above the surface of the BPSG film 102, where the gap between the lower level wiring is wide.

Subsequently, using a hydrofluoric acid solution diluted to 0.05% to 0.1% with pure water, chemical mechanical polishing is performed for the surface of the SOG film to form a SOG film 109b with flattened upper surface. Since the SOG film processed through the second heat treatment has higher etching rate for hydrofluoric acid type wet etching than that of the silicon oxide formed by normal chemical vapor deposition method or thermal oxidation method, flattening can be done quite easily. At this time, the film thickness of the SOG film 109b is in order of 300 nm above the lower level wiring 107A, 107B, 107C and 107D, for example. It is possible to add heat treatment at about 300° to 400° C.

Figure 4B:
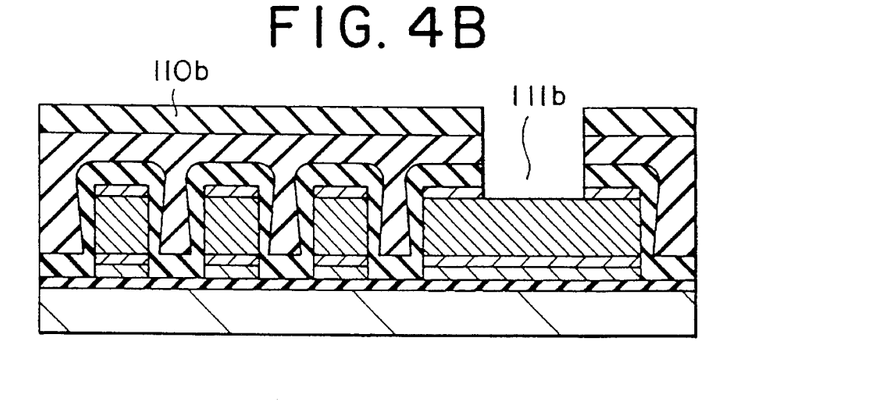

Next, as shown in FIG. 4B, in the similar matter to the foregoing first embodiment, a plasma oxide layer 110b in the thickness of about 300 nm is formed by plasma chemical vapor deposition. Thereafter, by way of anisotropic etching and so forth, a via hole 111b reaching the lower level wiring 107A is formed.

Figure 4C:
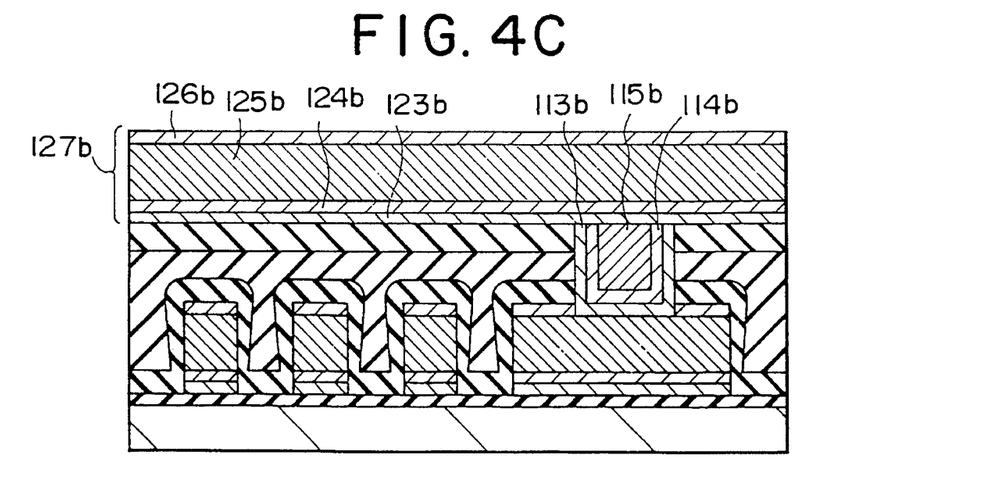

Next, as shown in FIG. 4C, in the similar manner to the first embodiment, titanium film 113b, titanium nitride film 114b and tungsten layer 115b are buried in the via hole 111b. Also, an upper level wiring is formed with a stacked metal film which is composed of titanium film 123b, titanium nitride film 124b, aluminum-copper-silicon alloy film 125b a titanium nitride film 126b.

The second embodiment as set forth above holds all effects achieved by the foregoing first embodiment. In addition, the shown embodiment has the interlayer insulation layer forming the undercoat for the upper level wiring and composed by the plasma oxide layer 108, the SOG film 109b and the plasma oxide layer 110b, which interlayer insulation layer has flattened upper surface. Therefore, alignment margin in photolithographic process for forming the upper level wiring 127b can be shortened in comparison with the first embodiment. Also, in the etching for forming the upper level wiring, residual of etching can be smaller than that in the first embodiment. Therefore, possibility of causing shorting between the upper level wiring can be further reduced.

Next, discussion will be given for the third embodiment of the present invention with reference to FIGS. 5A to 5C.

The shown embodiment is an application of the foregoing second embodiment and constructed as follows.

Figure 5A:
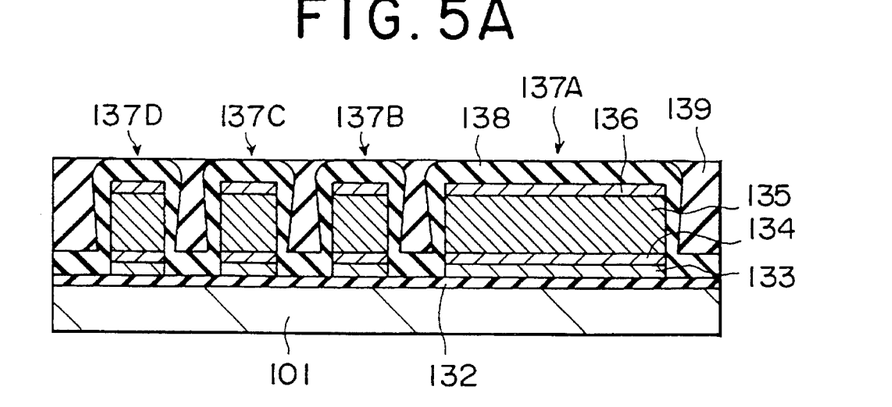
FIGS. 5A to 5C are diagrammatic sectional views showing fabrication process of the third embodiment of the present invention.

At first, as shown in FIG. 5A, after formation of necessary semiconductor elements on the silicon substrate 101, an undercoat layer 132 is formed on the silicon substrate 101. The upper surface of the undercoat 132 has a flat upper surface. The undercoat surface 132 is the silicon oxide type layer. After forming necessary contact holes (or via holes), lower level wiring 137A, 137B, 137C and 137D formed with the stacked metal layer which is composed of titanium film 133, titanium nitride film 134, aluminum-copper-silicon alloy film 135 and titanium nitride layer 136. The heights from the surface of the silicon substrate 101 to the upper surface of the lower level wiring 137A, 137B, 137C and 137D are equal to each other.

Furthermore, in the similar method to the foregoing first and second embodiments, a plasma oxide layer 138 is formed. The layer thickness of the plasma oxide layer 138 at a portion above the lower level wiring 137A and so forth is about 200 nm. Subsequently, in the similar manner to the second embodiment, the SOG film processed by the second heat treatment is formed to have about 1400 nm of film thickness at the portion above the surface of the lower level wiring 132 having wide gap. Then, using a hydrofluoric acid solution diluted to 0.05% to 0.1% with pure water, chemical mechanical polishing is performed for the SOG film until the upper surface of the plasma oxide layer 138 immediately above the lower level wiring 137A and so forth is exposed so that the upper surface of the SOG film 139 lies in the same plane to the upper surface of the plasma oxide layer 138 immediately above the lower level wiring 137A and so forth. As set forth above, in comparison with the plasma oxide layer 138, the SOG film 139 processed through the second heat treatment has a higher etching rate for hydrofluoric acid type wet etching. Thus, control of chemical mechanical polishing is easy.

Figure 5B:
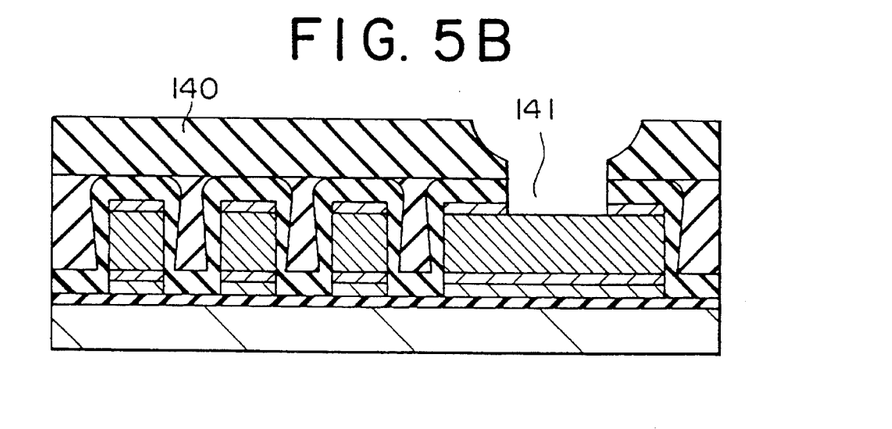

Next, as shown in FIG. 5B, in the similar matter to the foregoing second embodiment, a plasma oxide layer 140 in the thickness of about 500 nm is formed by plasma chemical vapor deposition for covering the upper surface of the SOG film 139 and the exposed upper surface of the plasma oxide layer 138. Thereafter, by way of known wet etching and anisotropic etching and so forth, a via hole 141 having large diameter at the upper portion and reaching the lower level wiring 137, for example, is formed.

Figure 5C:
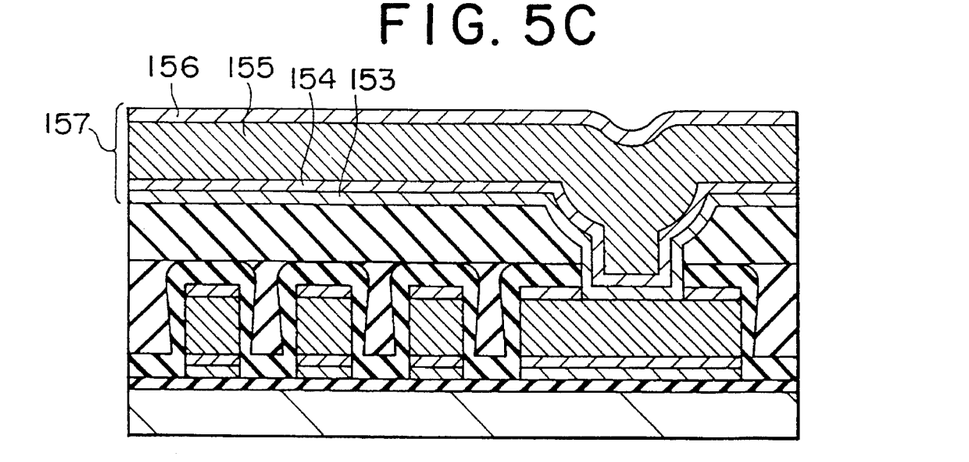

Subsequently, as shown in FIG. 5C, by way of sputtering under a pressure about 1 Pa, a titanium film 153, a titanium nitride film 154 (can be tungsten nitride film) and aluminum-copper-silicon alloy film (not shown) are formed sequentially. Thereafter, within the device, in which the foregoing sputtering is performed and with maintaining pressure at about 1 Pa. the temperature is elevated at about 400° C. to cause reflow in the aluminum-copper-silicon alloy film to form an aluminum-copper-silicon alloy film 155. Then, after lowering temperature, a titanium nitride film 156 (can be tungsten nitride film) covering the surface of the tungsten layer 155 is formed. Then, by patterning these four films, an upper level wiring 157 is formed.

The foregoing third embodiment holds all of the effects to be achieved by the second embodiment. In addition, since the shown embodiment can form via hole 141 by only etching of the plasma oxide layers 140 and 138 without requiring of etching of the SOG film 139, the configuration of the via hole can be as that of the via hole 141. By this, different from the foregoing first and second embodiments, formation and processing of the stacked metal film filling the via hole, namely the processes for forming the titanium film 113a, the titanium nitride film 114a and the tungsten layer 115a and etching back process thereof can be neglected.

Figure 6A:
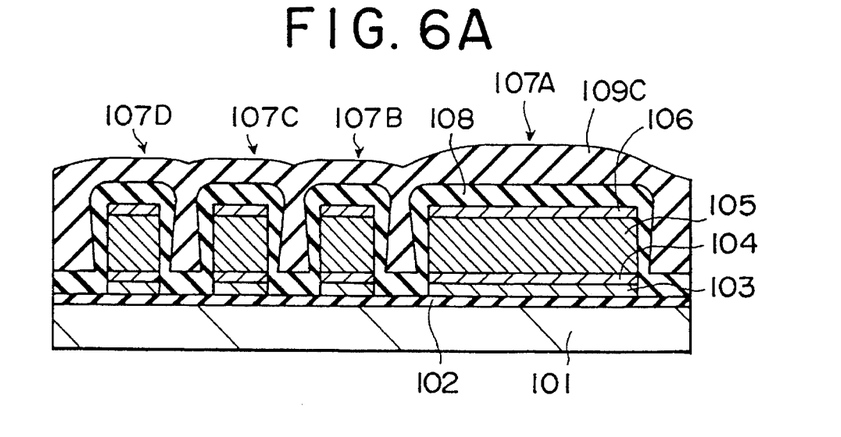
FIGS. 6A to 6E are diagrammatic sectional views showing fabrication process of the fourth embodiment of the present invention.

Next, discussion will be given for the fourth embodiment of the present invention with reference to FIGS. 6A to 6E. At first, as shown in FIG. 6A, the plasma oxide layer 108 (layer thickness is the same as that in the first embodiment) and a SOG film 109C are formed in the same manner to the first embodiment. The film thickness of the SOG film 109C is about 200 to 300 nm at a portion above the upper surfaces of the lower level wiring 107A, 107B, 107C and 107D, and about 700 μm at a portion immediately above the BPSG film at a portion where the gap between the lower level wiring is wide.

Figure 6B:
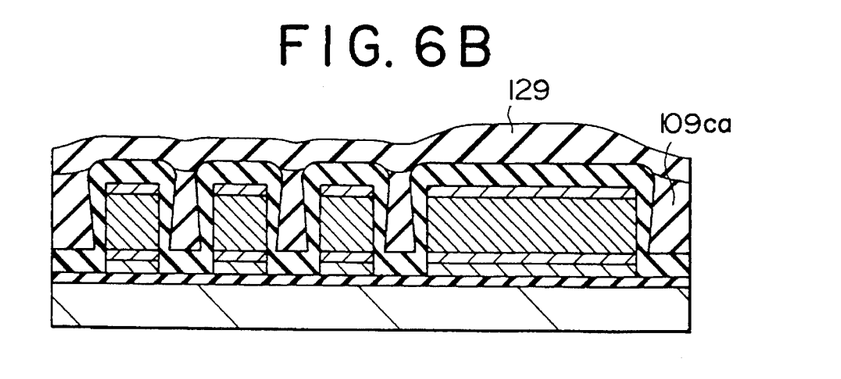

Subsequently, as shown in FIG. 6B, oxygen plasma process is performed. Thereafter, a third heat treatment is performed at a temperature of 300° C. for 1 hour under nitrogen atmosphere. By these series of process about 400 nm of depth from the SOG film 109C is converted into a SOG film 129. Thus, all of the SOG film immediately above the lower level wiring 107A, 107B, 107C and 107D become the SOG film 129. Then, non-converted SOG 109ca is maintained between the lower level wiring. One example of the oxygen plasma process is as follows. Pressure is about 200 Pa. Temperature is about 200° C. Oxygen flow rate is about 200 sccm, and a microwave power is 1400 W, and the process period is about 10 minutes.

By the foregoing oxygen plasma process, Si—H bond in the SOG film 129 is oxidized to be partly converted into silanol radical (Si—OH) and partly converted into siloxane bond (Si—O—Si). By the foregoing third heat treatment, dehydrogenation is caused primarily in the silanol radical so that solidified SOG film can be obtained. The etching rate of the SOG film for hydrofluoric acid type wet etching is greater than the normal silicon oxide layer but smaller than that of the SOG film 109c. In the series of processes as set forth above, the shrinkage rate of the SOG film 129 in comparing with the SOG film immediately after pre-baking is about 2%. With respect to the silicon substrate 101, the SOG film 129 has about $0.5 \times 10^8$ Pa of tensile stress. The shrinkage rate and the magnitude of the stress are greater than those of the SOG film 109c but smaller than those of the SOG film processes at 400° C. in the second heat treatment. It should be noted that the preferred range of the third heat treatment is 300° to 400° C.

Figure 6C:
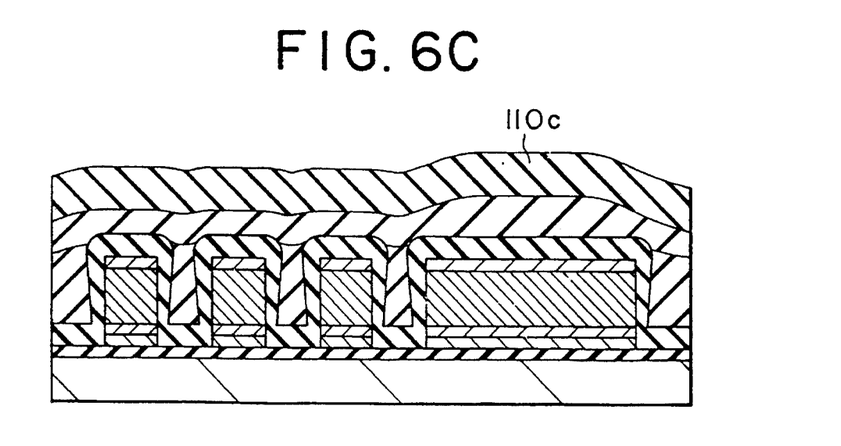

Next, as shown in FIG. 6C, in a similar manner to the foregoing first embodiment, a layer approximately 500 nm thickness of plasma oxide 110c is formed over the surface of the SOG film 129.

Figure 6D:
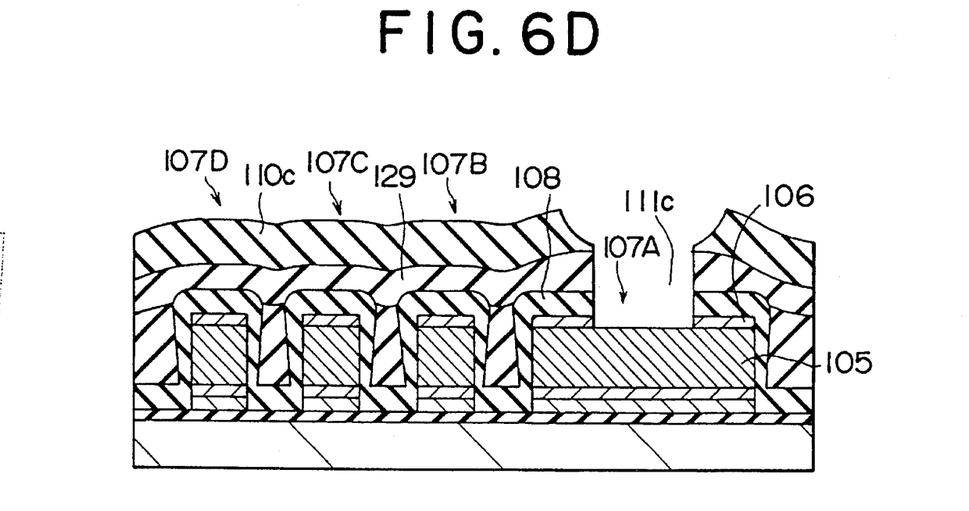

Subsequently, as shown in FIG. 6D, utilizing the fact that the SOG film 129 is solidified, a via hole 111c having the same configuration to the via hole 141 of the third embodiment is formed.

Figure 6E:
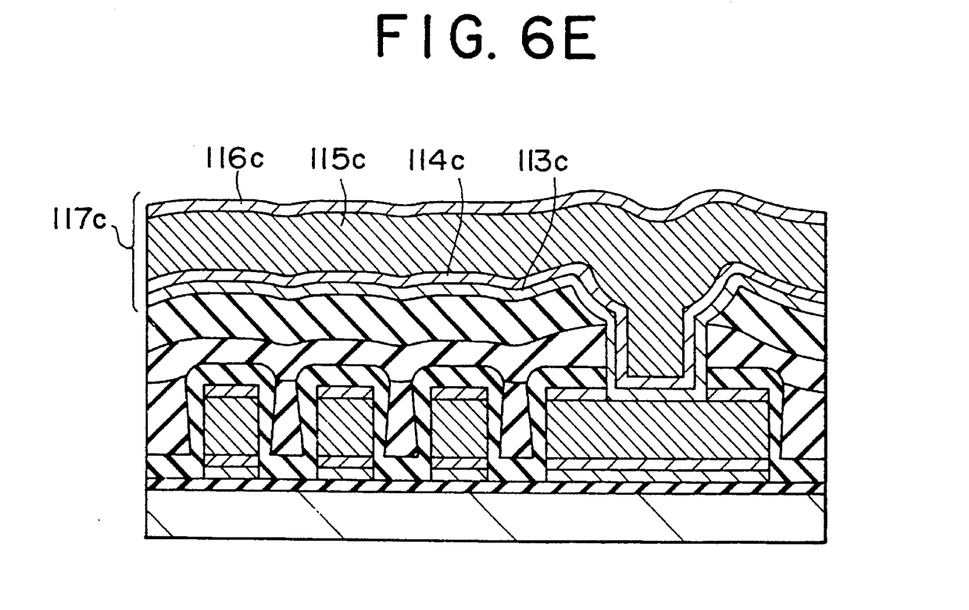

Then, as shown in FIG. 6E, in the similar manner to the third embodiment, a stacked metal film composed of titanium film 113c, titanium nitride film 114c, a reflown tungsten layer 115c and a titanium nitride layer 116c is formed and patterned to form the upper level wiring 117c.

The foregoing fourth embodiment achieves the same effects achieved by the first embodiment. Concerning the shortening of the process steps in formation of the stacked metal and the processing thereof, the same effect to the third embodiment can be achieved.

It should be noted that, similar to the second embodiment, it is possible to form reflown SOG film, flattening of the surface of the SOG film by chemical mechanical polishing or so forth and then perform oxidation plasma process and third heat treatment.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiment which can be embodied within a scope encompassed and equivalents thereof with respect to the feature set out in the appended claims.

What is claimed is:

1. A fabrication process for a semiconductor device comprising the steps of:
    forming a plurality of lower level wiring, disposing insulation layer therebetween, on the surface of a silicon substrate;
    forming a first silicon oxide layer covering the surfaces of said lower level wiring and the surface of said insulation layer by a first plasma chemical vapor deposition method;
    forming an inorganic SOG film containing Si—H coupling and covering said first silicon oxide layer by applying a solution containing hydrogenated silsesquioxane $((HSiO_{3/2})_n)$ as a primary component and pre-baking by a first thermal process;
    performing reflow of said SOG film by a second thermal process at a temperature higher than that of said first thermal process;
    forming a second silicon oxide layer covering the surface of reflown SOG film by a second plasma chemical vapor deposition; and
    forming an upper level wiring over said second silicon oxide layer.

2. A fabrication process for a semiconductor device as set forth in claim 1, wherein said lower level wiring is a film selected from a group of aluminum or aluminum alloy film, copper or copper alloy film, gold or gold alloy film and stacked film of at least one of the films and other film.

3. A fabrication process for a semiconductor device as set forth in claim 1, which further comprises a step of flattening said reflown SOG film by chemical mechanical polishing method.

4. A fabrication process for a semiconductor device as set forth in claim 1, wherein at least one of said first plasma chemical vapor deposition method and said second plasma chemical vapor deposition method is a plasma chemical vapor deposition employing tetraethylorthosilicate and oxygen as materials.

5. A fabrication process for a semiconductor device as set forth in claim 1, wherein at least one of said first plasma chemical vapor deposition method and said second plasma chemical vapor deposition method is a plasma chemical vapor deposition employing silane and nitrogen monoxide as materials.

6. A fabrication process for a semiconductor device comprising the steps of:
    forming a plurality of lower level wiring, disposing insulation layer therebetween, on the surface of a silicon substrate;
    forming a first silicon oxide layer covering the surfaces of said lower level wiring and the surface of said insulation layer by a first plasma chemical vapor deposition method;
    forming an inorganic SOG film containing Si—H coupling and covering said first silicon oxide layer by applying a solution containing hydrogenated silsesquioxane $((HSiO_{3/2})_n)$ as a primary component and pre-baking by a first thermal process;
    performing reflow of said SOG film by a second thermal process at a temperature higher than that of said first thermal process;
    performing oxygen plasma process for the surface of the reflown SOG film;
    solidifying said SOG film processed by oxygen plasma process by a third thermal process at a temperature higher than said first thermal process;
    forming a second silicon oxide layer covering the surface of reflown SOG film by a second plasma chemical vapor deposition; and
    forming upper level wiring over said second silicon oxide layer.

7. A fabrication process for a semiconductor device as set forth in claim 6, wherein said lower level wiring is a film selected from a group of aluminum or aluminum alloy film, copper or copper alloy film, gold or gold alloy film and stacked film of at least one of the films and other film.

8. A fabrication process for a semiconductor device as set forth in claim 6, which further comprises a step of flattening said reflown SOG film by chemical mechanical polishing method.

9. A fabrication process for a semiconductor device as set forth in claim 6, wherein at least one of said first plasma chemical vapor deposition method and said second plasma chemical vapor deposition method is a plasma chemical vapor deposition employing tetraethylorthosilicate and oxygen as materials.

10. A fabrication process for a semiconductor device as set forth in claim 6, wherein at least one of said first plasma chemical vapor deposition method and said second plasma chemical vapor deposition method is a plasma chemical vapor deposition employing silane and nitrogen monoxide as materials.

* * * * *